(12) United States Patent
Campbell et al.

(10) Patent No.: US 8,966,975 B2
(45) Date of Patent: Mar. 3, 2015

(54) METHOD AND APPARATUS FOR PACKAGING CRASH SENSORS

(75) Inventors: Curt Douglas Campbell, Farmington Hills, MI (US); Neil Gordon Murray, Jr., Wixom, MI (US); Dion Parker, Livonia, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 607 days.

(21) Appl. No.: 13/002,696

(22) PCT Filed: Jul. 27, 2009

(86) PCT No.: PCT/US2009/051849
§ 371 (c)(1), (2), (4) Date: Jan. 5, 2011

(87) PCT Pub. No.: WO2010/014550
PCT Pub. Date: Feb. 4, 2010

(65) Prior Publication Data
US 2011/0107835 A1  May 12, 2011

Related U.S. Application Data

(60) Provisional application No. 61/084,124, filed on Jul. 28, 2008.

(51) Int. Cl.
G01P 15/00  (2006.01)
H05K 5/00  (2006.01)
B29C 45/14  (2006.01)
B29C 45/16  (2006.01)
(Continued)

(52) U.S. Cl.
CPC ........ *H05K 5/0034* (2013.01); *B29C 45/14655* (2013.01); *B29C 45/1671* (2013.01); *B29C 45/1676* (2013.01); *G01P 1/023* (2013.01); *H05K 3/284* (2013.01); *H05K 5/0078* (2013.01); *H05K 2201/0133* (2013.01); *H05K 2203/1316* (2013.01); *H05K 2203/1322* (2013.01)
USPC .......... 73/493; 280/735; 73/204.26; 361/752; 361/796

(58) Field of Classification Search
USPC .................................. 73/12, 204.26; 361/796
See application file for complete search history.

(56) References Cited

U.S. PATENT DOCUMENTS 5,462,622 A   10/1995   Small et al.
5,706,181 A   1/1998    Dirmeyer et al.
6,637,788 B1  10/2003   Zollner et al.
(Continued)

FOREIGN PATENT DOCUMENTS

JP   H07-23672 U   5/1995
JP   2003-083774   3/2003
(Continued)

*Primary Examiner* — Peter Macchiarolo
*Assistant Examiner* — Mohammed Keramet-Amircola
(74) *Attorney, Agent, or Firm* — Tarolli, Sundheim, Covell & Tummino LLP

(57) ABSTRACT

A crash sensor assembly including a printed circuit board and a crash sensor mounted on the printed circuit board, At least one connector pin is mounted to the printed circuit board so as to permit external electrical communication with the crash sensor. A first insert molded soft inner layer of material partially covers the printed circuit board and covers the crash sensor, and a second overmolded hard outer layer of material covers the first soft inner layer of material and bonded thereto and rigidly contacts the printed circuit board.

6 Claims, 2 Drawing Sheets

(51) Int. Cl.
*G01P 1/02* (2006.01)
*H05K 3/28* (2006.01)

(56) References Cited

U.S. PATENT DOCUMENTS

| | | | |
|---|---|---|---|
| 6,891,239 B2* | 5/2005 | Anderson et al. | 257/414 |
| 7,116,215 B2* | 10/2006 | Oonishi | 340/436 |
| 7,181,968 B2* | 2/2007 | Still | 73/493 |
| 7,819,004 B2* | 10/2010 | Steele et al. | 73/493 |
| 2003/0155753 A1 | 8/2003 | Breed | |
| 2007/0152433 A1* | 7/2007 | Weichenberger et al. | 280/735 |
| 2007/0157699 A1* | 7/2007 | Manlove et al. | 73/12.01 |
| 2009/0039498 A1* | 2/2009 | Bayerer | 257/700 |

FOREIGN PATENT DOCUMENTS

| | | |
|---|---|---|
| JP | 2004-236617 A | 8/2004 |
| JP | 2005-043211 A | 2/2005 |
| JP | 2005-155827 A | 6/2005 |
| JP | 2005-319922 | 11/2005 |
| JP | 2007-320998 | 12/2007 |
| KR | 10-0178600 | 5/1999 |
| KR | 1999-0023449 U | 7/1999 |
| KR | 10-0378509 | 8/2003 |
| WO | WO2007/024363 A1 | 3/2007 |

* cited by examiner

METHOD AND APPARATUS FOR PACKAGING CRASH SENSORS

RELATED PATENT APPLICATION

This application claims priority from U.S. Provisional Patent Application Ser. No. 61/084,124, filed Jul. 28, 2008, the subject matter of which is incorporated hereby incorporated by reference in its entirety.

FIELD OF THE INVENTION

The present invention is directed to vehicle crash sensors and is more particularly direct to a method and apparatus for packaging vehicle crash sensors.

BACKGROUND OF THE INVENTION

Actuatable vehicle occupant protection systems are known in the art. Such protection systems may include one or more vehicle crash sensors for detecting the occurrence of a vehicle crash condition. When a vehicle crash condition is detected, the protection system may actuate an inflatable device, such as an air bag, for helping to protect an occupant of the vehicle.

Certain types of vehicle crash sensors may include mechanical devices, such as switches, that close in response to deformation of the vehicle. The closure of the mechanical device indicates the occurrence of a vehicle crash condition. Other vehicle crash sensors may include electrical devices, such as an accelerometer, for detection of a crash condition. When a processed output of the electrical device crosses a threshold level, a vehicle crash condition is determined.

Vehicle crash sensors for detecting a side impact to a vehicle must have particularly rapid response times as the time period for actuating an inflatable device for occupant protection during a side impact is significantly less than the time period for actuating an inflatable device for occupant protection during a front impact. To help improve the response time of a vehicle crash sensor for sensing side impacts, it is common to locate the vehicle crash sensor at the side of the vehicle, such as on a side pillar or within the door of the vehicle.

Crash sensors may be subject to harsh environmental conditions because of their mounting locations.

SUMMARY OF THE INVENTION

In accordance with one embodiment of the present invention, a crash sensor assembly includes a printed circuit board and a crash sensor mounted on the printed circuit board. At least one connector pin is mounted to the printed circuit board so as to permit external electrical communication with the crash sensor. A first insert molded soft inner layer of material partially covers the printed circuit board and covers the crash sensor, and a second overmolded hard outer layer of material covers the first soft inner layer of material and bonded thereto and rigidly contacts the printed circuit board.

In accordance with another embodiment of the present invention, a crash sensor assembly is provided comprising a printed circuit board; a crash sensor mounted on the printed circuit board; and processing circuitry mounted on the printed circuit board and connected to said crash sensor for processing a signal from the crash sensor. At least one connector is mounted to the printed circuit board so as to permit external electrical communication with the processing circuitry. A first insert molded soft inner layer of material partially covers the printed circuit board, and covers the crash sensor, and the processing circuitry. A second overmolded hard layer of material covers the first inner material and is bonded thereto and contacts the printed circuit board.

In accordance with another embodiment of the present invention, a method is provided for assembling a crash sensor comprising the steps of mounting a crash sensor to a printed circuit board, mounting at least one connector to the printed circuit board so as to permit electrical communication with the crash sensor, insert molding a soft elastomeric inner layer of material to circuit board so as to partially cover the printed circuit board and cover the crash sensor, and overmolding a hard outer layer of material over the first inner layer material and the printed circuit board.

In accordance with another embodiment of the present invention, a method is provided for assembling a crash sensor comprising the steps of mounting a crash sensor to a printed circuit board, mounting processing circuitry to the printed circuit board and connecting the processing circuitry to said crash sensor for processing a signal from the crash sensor, mounting at least one connector to the printed circuit board and connecting the at least one connector to the processing circuitry to permit electrical communication with the processing circuitry, insert molding a soft elastomeric inner layer of material to circuit board so as to partially cover the printed circuit board, and cover the crash sensor, and the processing circuitry, and overmolding a hard outer layer of material over the first inner layer of material and the printed circuit board.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION

Figure 1:
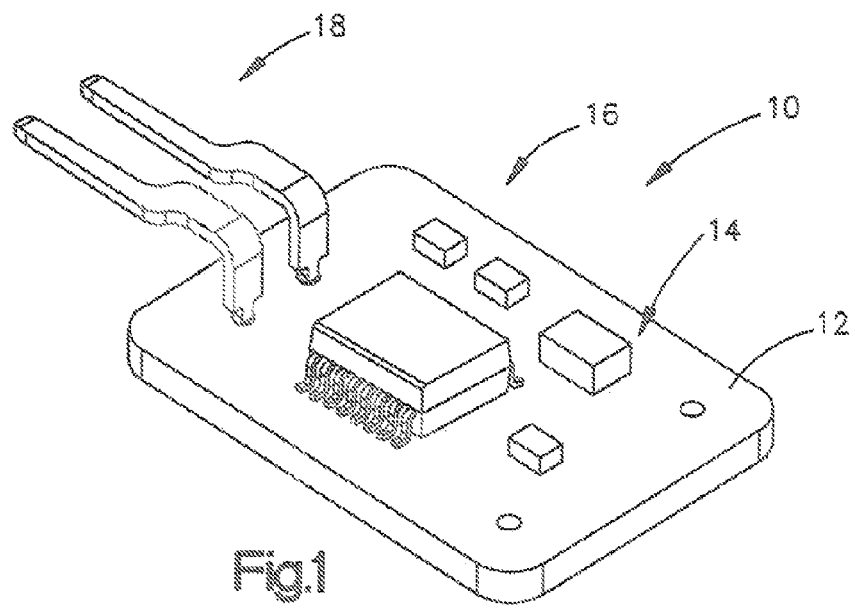
FIG. 1 is a schematic diagram of a printed circuit board ("PCB") sub-assembly having a crash sensor and associated processing circuitry mounted thereon in accordance with one example embodiment of the present invention.

Referring to FIG. 1, a crash sensor assembly 10, made in accordance with one example embodiment of the present invention, is shown. The crash sensor assembly 10 includes a printed circuit board ("PCB") 12 having a crash sensor in the form an accelerometer 14 and associated processing circuitry 16 operatively mounted thereon. In this application, the words "printed circuit board" is meant to also cover substrate, lead frame, printed wire board, armature, flex circuits, bus bar, and metal wire substrate and/or any device that provides interconnects between the electronic components and terminal connections for external communications. Connectors 18 provide electrical connection to a vehicle bus to communicate with other actuatable restraint control circuitry of the vehicle in any known manner.

The crash sensor assembly 10 may be a front crash sensor, a side crash sensor, roll-over sensor, or positioned in any other known orientation so as to accomplish a desired result. The mounting location of the sensor assembly 10 can also be at any vehicle location.

To environmentally protect the sensor assembly 10, the sensor is overmolded or insert molded with a soft rubber/plastic material so as to partially surround the electronic circuit board and electronics and protect them from moisture exposure. This material also prevents thermal expansion shear damage to the electron components and their solder attachments on the circuit board. Certain, selective portions of the circuit board remain exposed for hard contact to a hard outer shell material molded in a second process step. The electronic devices, such as accelerometers, resistors, capacitors and diodes are fully surrounded by the soft elastomeric plastic. A hard outer shell is then molded over the first softer layer so as to bond to the inner soft rubber/plastic material to provide mechanical protection for the electron circuitry and also to transmit the crash impact pulse to the circuit board mounted accelerometer 14 because of the direct contact between the harder outer layer and the circuit board 12. The hard outer shell also provides a mounting interface to the vehicle body. The hard outer shell forms a continuous seamless molded structure around the electronic components that improves crash impulse acceleration force transmission from the vehicle body to the accelerometer 14.

Figure 2:
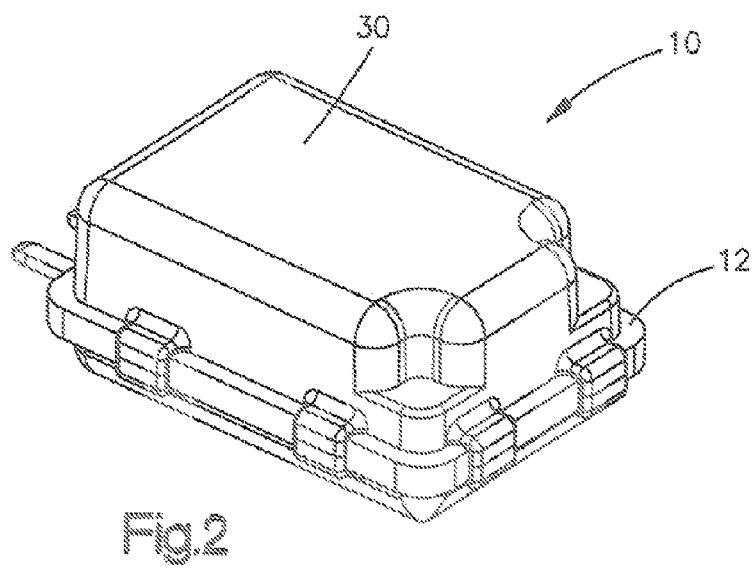
FIG. 2 is schematic diagram of the PCB of FIG. 1 after it is insert molded with a first soft inner layer.
Figure 3:
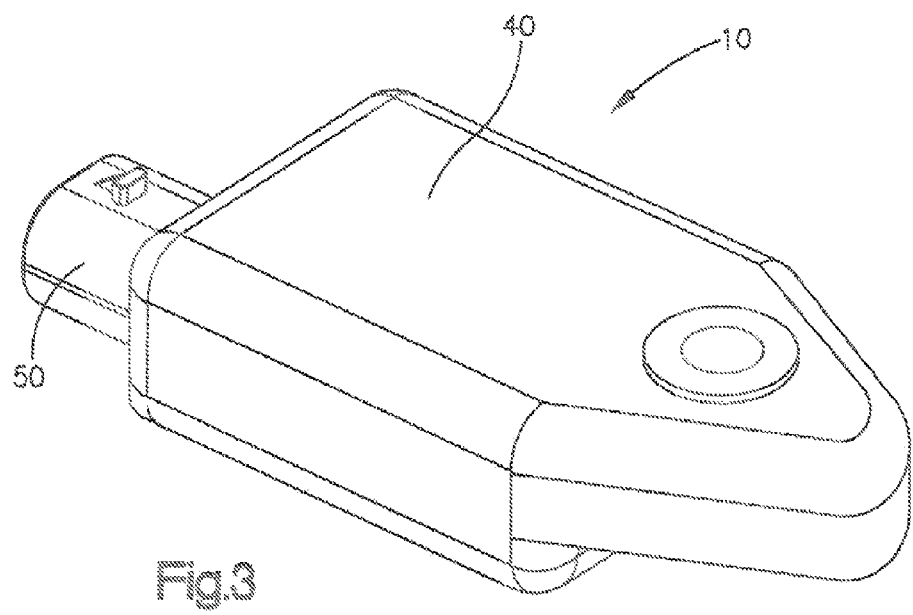
FIG. 3 is a schematic diagram of the PCB of FIG. 1-2 insert molded with a second harder outer layer to its final design form.
Figure 4:
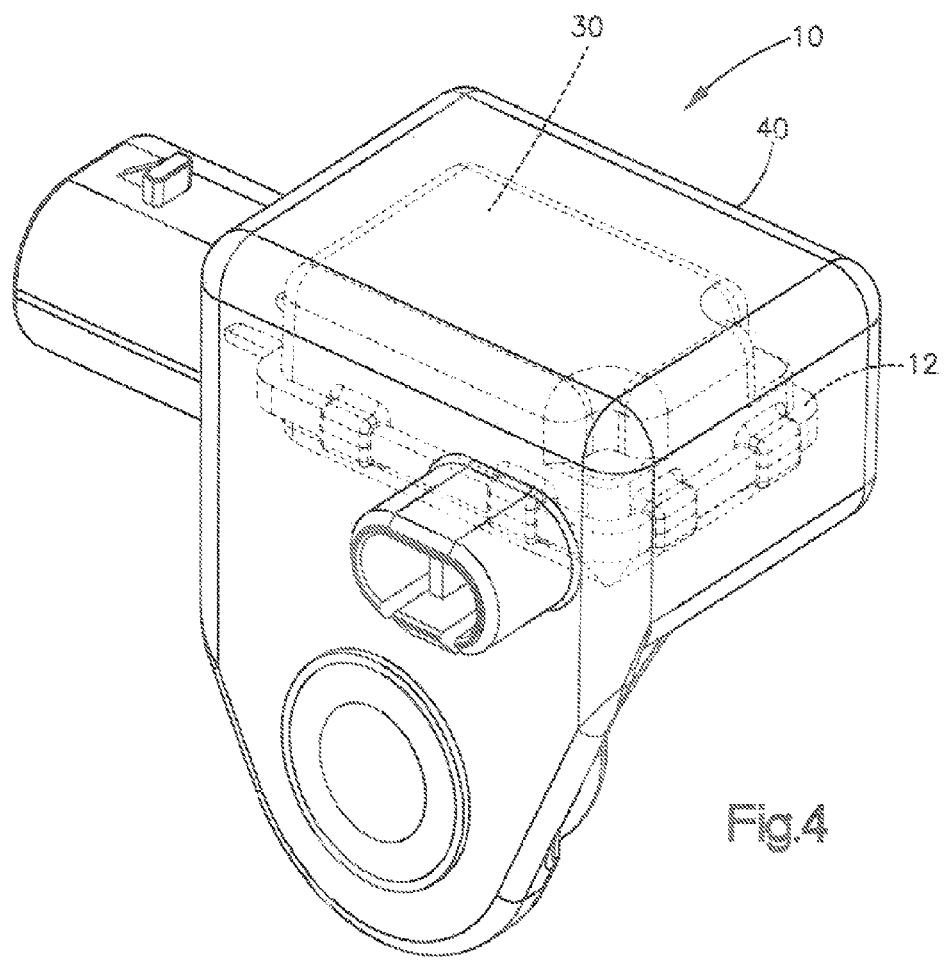
FIG. 4 is a side perspective view of the PCB of FIGS. 1-2 insert molded with a second harder outer layer to another final shape.

Referring to FIGS. 2-4, the circuit board 10 is insert molded with the soft rubber/plastic elastomeric polymer (such TPE (thermoplastic elastomer)) material 30 to cover all the components 14, 16 as shown. A hard outer plastic body 40 (See FIG. 4) (such as PA66 GF (polyamide 6, polyamide 66) PBT (polybutylene terephthalate)) is bonded to the soft inner layer 30 and the circuit board 12 through an injection overmolding process. The hard outer shell 40 provides the mechanical attachment to the vehicle body (not shown) and provides a vehicle wiring harness housing 50. Bonding and adhesion between the two layer materials (soft inner layer and the hard outer layer) is an important factor in material selection.

The final shape of the outer housing 40, 40' can be any desired shape.

From the above description of the invention, those skilled in the art will perceive improvements, changes and modifications. Such improvements, changes and modifications within the skill of the art are intended to be covered by the appended claims.

Having described the invention, the following is claimed:

1. A crash sensor assembly comprising:
a printed circuit board;
a crash sensor mounted on the printed circuit board;
at least one connector pin mounted to the printed circuit board so as to permit external electrical communication with the crash sensor;
a first insert molded soft inner layer of material only partially covering the printed circuit board and covering the crash sensor to protect the crash sensor from moisture exposure; and
a second overmolded hard outer layer of material covering the first soft inner layer of material and bonded thereto and rigidly contacting the printed circuit board so as to permit transmission of a crash impact pulse to the crash sensor on the printed circuit board and to provide a mounting interface.

2. The crash sensor of claim 1 in which the soft inner layer of material is a thermoplastic elastomer.

3. The crash sensor of claim 1 in which the hard outer layer of material is a polybutylene terephthalate.

4. A crash sensor assembly comprising:
a printed circuit board;
a crash sensor mounted on the printed circuit board;
processing circuitry mounted on the printed circuit board and connected to said crash sensor for processing a signal from the crash sensor;
at least one connector mounted to the printed circuit board so as to permit external electrical communication with the processing circuitry;
a first insert molded soft inner layer of material only partially covering the printed circuit board, and covering the crash sensor, and the processing circuitry to protect the crash sensor and processing circuitry from moisture exposure; and
a second overmolded hard layer of material covering the first inner material and bonded thereto and contacting the printed circuit board so as to permit transmission of a crash impact pulse to the crash sensor on the printed circuit board and to provide a mounting interface.

5. A method for assembling a crash sensor comprising the steps of:
mounting a crash sensor to a printed circuit board;
mounting at least one connector to the printed circuit board so as to permit electrical communication with the crash sensor;
insert molding a soft elastomeric inner layer of material to circuit board so as to only partially cover the printed circuit board and cover the crash sensor to protect the crash sensor from moisture exposure; and
overmolding a hard outer layer of material over the first inner layer material and the printed circuit board so as to permit transmission of a crash impact pulse to the crash sensor on the printed circuit board and to provide a mounting interface.

6. A method for assembling a crash sensor comprising the steps of:
mounting a crash sensor to a printed circuit board;
mounting processing circuitry to the printed circuit board and connecting the processing circuitry to said crash sensor for processing a signal from the crash sensor;
mounting at least one connector to the printed circuit board and connecting the at least one connector to the processing circuitry to permit electrical communication with the processing circuitry;
insert molding a soft elastomeric inner layer of material to circuit board so as to only partially cover the printed circuit board, and cover the crash sensor, and the processing circuitry to protect the crash sensor and processing circuitry from moisture exposure; and
overmolding a hard outer layer of material over the first inner layer of material and the printed circuit board so as to permit transmission of a crash impact pulse to the crash sensor on the printed circuit board and to provide a mounting interface.

* * * * *